(12) United States Patent
Hurley et al.

(10) Patent No.: US 8,327,312 B2
(45) Date of Patent: Dec. 4, 2012

(54) ASSESSING PRINTABILITY OF A VERY-LARGE-SCALE INTEGRATION DESIGN

(75) Inventors: Paul T. Hurley, Zurich (CH); Krzysztof Kryszczuk, Zurich (CH); Juri Ranieri, Chavannes-pres-Renens (CH); Robin Scheibler, Tokyo (JP)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/191,750

(22) Filed: Jul. 27, 2011

(65) Prior Publication Data

US 2012/0030643 A1 Feb. 2, 2012

(30) Foreign Application Priority Data

Jul. 27, 2010 (EP) .................................. 10170884

(51) Int. Cl.
*G06F 11/22* (2006.01)
*G06F 17/50* (2006.01)
(52) U.S. Cl. .................. 716/136; 716/106; 716/111
(58) Field of Classification Search .................. 716/106, 716/111, 136
See application file for complete search history.

(56) References Cited

U.S. PATENT DOCUMENTS

| | | | |
|---|---|---|---|
| 6,423,982 B2 * | 7/2002 | Nishibayashi et al. | 257/77 |
| 7,941,768 B1 * | 5/2011 | Wei | 716/54 |
| 2011/0066266 A1 * | 3/2011 | Nakano | 700/98 |

* cited by examiner

*Primary Examiner* — Thuan Do
*Assistant Examiner* — Brian Ngo
(74) *Attorney, Agent, or Firm* — Scully, Scott, Murphy & Presser, P.C.; Gail H. Zarick, Esq.

(57) ABSTRACT

Printability of a very-large-scale integration design is assessed by: during a training phase, generating a training set of very-large-scale integration design shapes representative of a population of very-large-scale integration design shapes, obtaining a set of mathematical representations of respective shapes in the training set, identifying at least two classes of physical events causally linked to the printability for the very-large-scale integration design shapes, each of the classes being associated to a respective level of printability, labeling each mathematical representation of the set according to one of the identified classes, based on a lithography model, and selecting a probabilistic model function maximizing a probability of a class, given the set of mathematical representations; and during a testing phase, providing a very-large-scale integration design shape to be tested, testing the provided very-large-scale integration design shape, and labeling the provided very-large-scale integration design shape according to the identified class.

25 Claims, 2 Drawing Sheets

ASSESSING PRINTABILITY OF A VERY-LARGE-SCALE INTEGRATION DESIGN

BACKGROUND

The instant application claims priority from European Patent Application No. 10170884.0 filed on Jul. 27, 2010 with the European Patent Office.

The present disclosure generally relates to the field of very-large-scale integration design process, and specifically to the assessment of the printability of a layout.

Design Rule Check (DRC) is the first step in the modern very-large-scale integration (VLSI) design process and it uses a large set of rules to eliminate non-printable design patterns from a layout. The DRC applies a set of heuristic design rules that preclude certain design patterns from the design space, and the design rules separate the VLSI design process from the manufacturing process. The DRC creation process is a legacy of pre-100 nm VLSI design era, when a relatively small and simple set of rules could be followed by the layout designers, effectively reducing the risk of low manufacturing yield. Even after substantial extension of the rule set for the sub-100 nm technology nodes, the DRC strategy does not provide satisfactory yield during manufacturability and the design must be revisited multiple times before it reaches production stage.

At the same time, the requirements resulting from the optical properties of the printing process drive the rapid escalation of the number and complexity of the DCR rules. Indeed, creating DRC rules requires a labor-intensive, collaborative effort at the early stage of each technology node. In spite of that effort, the archaic principles driving the creation and use of DRC in combination with the growing complexity of the job at hand cause that i) DRC check pronounces as printable patterns that do not print reliably, and ii) patterns that are valuable from the design perspective and print correctly are erroneously banned by the DRC process. In other terms, false positive and false negative can result of the DRC process.

In order to bypass these problems, solutions have been developed. For instance, it has been proposed to drastically reduce the number of patterns in order to restrict the design space to those shapes and constructs that are guaranteed to be printable. A similar approach, which postulates radical layout regularization for 32 nm technology node, is referred to as prescriptive layout design. In other approach, a semi-automatic generation of new DRC rules (referred to as DRC Plus) has been proposed. The DRC Plus rules are created through identification of classes of design patterns that are likely to cause printability errors. Those patterns are forbidden and removed from the design space, which is a conceptually similar to the prescriptive design principle. However, the application of the DRC Plus may still eliminate perfectly printable patterns.

However, DRC has several drawbacks: DRC is slow, labor-intensive, ad-hoc, inaccurate and excessively restrictive. More precisely, the current DRC process suffers from the following problems:

1. The process is generating a very large number of rules, which also tend to be excessively conservative to avoid yield problems in manufacturing.
2. The complexity and the number of the DRC rules make it a nontransparent, restrictive and suboptimal tool, which prohibits many shapes that actually can be printed.
3. The rules are frequently linked to particular printing problems encountered rather than to the physical phenomena that occur during printing. This fact, in conjunction with the large number of existing rules, creates a situation where rules can be partially redundant and overly restrictive.
4. The number of rules makes tracing of the dependencies between the new rules and the existing ones very hard.
5. The process is not scalable to new technology nodes: it is not obvious if and which of the old rules should hold in the new technology node, and new rules must be added via labor-expensive non-automated error analysis, and rule design.

Thus, according to the limitations of the existing solution shortly discussed above, there is a need for replacing the inefficient set of design rules with a new printability check process able to produce fast, accurate, autonomous printability prediction for lithography, preferably in new technology nodes (e.g. 22 nm, 15 nm).

BRIEF SUMMARY

According to a first aspect, the disclosure is embodied as a method of assessing printability of a very-large-scale integration design for creating an integrated circuit. The method comprises:

a. during a training phase:
   i. generating a training set of very-large-scale integration design shapes representative of a population of very-large-scale integration design shapes;
   ii. obtaining a set of mathematical representations of respective shapes in the training set;
   iii. identifying at least two classes of physical events causally linked to the printability for the very-large-scale integration design shapes, each of the classes being associated to a respective level of printability;
   iv. labeling each mathematical representation of the set according to one of the identified classes, based on a lithography model;
   v. selecting a probabilistic model function maximizing a probability of a class, given the set of mathematical representations;
b. and during a testing phase:
   i. providing a very-large-scale integration design shape to be tested;
   ii. testing the provided very-large-scale integration design shape by
      1. obtaining a mathematical representation of the provided very-large-scale integration design shape;
      2. computing estimates of posterior probabilities for each of the identified classes, given the obtained mathematical representation;
      3. identifying the class with the highest estimate of posterior probabilities obtained; and
   iii. labeling the provided very-large-scale including at least one memory drive and a processor drive integration design shape according to the identified class, wherein a computer system is configured to perform one or more said first set and second set of steps.

In embodiments, the method may comprise one or more of the following features:

1. At both the training and testing phases, a step of obtaining a mathematical representation comprises transforming a very-large-scale integration design shape into spatial-frequency domain;
2. A mathematical representation is a fixed-length vector representation;
3. The probabilistic model function is selected according to a probably approximately correct learning algorithm;
4. A first class is associated to a level of printability corresponding to a printable very-large-scale integration design shape, and a second class is associated to a to level of printability corresponding to a non-printable very-large-scale integration design shape;

5. The training set of very-large-scale integration design shapes comprises at least one very-large-scale integration design shape violating a predetermined design rule;
6. The predetermined design rule is selected so that said at least one very-large-scale integration design shape is erroneously identified as violating the predetermined design rule;
7. The testing phase is carried out while creating the integrated circuit;
8. The testing phase is carried out once the integrated circuit is created.

According to another aspect, the disclosure is embodied as a system for creating an integrated circuit using very-large-scale integration design, the system comprising means for implementing the steps of the method of the disclosure.

According to another aspect, the disclosure is embodied as a computer program, stored on a computer readable medium, for assessing printability of a very-large-scale integration design for creating an integrated circuit, comprising code means for causing a computer to take the steps of the method of the disclosure.

BRIEF DESCRIPTION OF THE SEVERAL VIEWS OF THE DRAWINGS

A process and a system embodying the disclosure will now be described, by way of non-limiting example, and in reference to the accompanying drawings, where.

DETAILED DESCRIPTION

Figure 1:
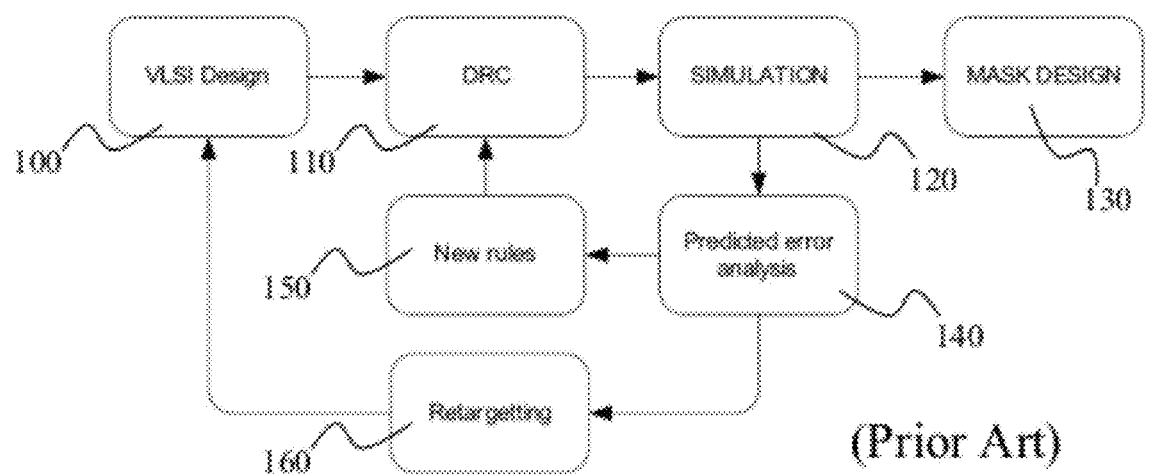
FIG. 1 is an example of a VLSI design cycle as known in the art.

The disclosure is directed to a method of assessing printability of a very-large-scale integration (VLSI) design for creating an integrated circuit. The method comprises two phases, a training phase and a testing phase. The training phase comprises i) generating a training set of very-large-scale integration design shapes representative of a population of very-large-scale integration design shapes, ii) obtaining a set of mathematical representations of respective shapes in the training set, iii) identifying at least two classes of physical events causally linked to the printability for the very-large-scale integration design shapes, each of the classes being associated to a respective level of printability, iv) labeling each mathematical representation of the set according to one of the identified classes, based on a lithography model, and v) selecting a probabilistic model function maximizing a probability of a class, given the set of mathematical representations. The testing phase comprises i) providing a very-large-scale integration design shape to be tested, ii) testing the provided very-large-scale integration design shape by (1) obtaining a mathematical representation of the provided very-large-scale integration design shape, (2) computing estimates of posterior probabilities for each of the identified classes, given the obtained mathematical representation, and (3) identifying the class with the highest estimate of posterior probabilities obtained. The testing phase further comprises iii) labeling the provided very-large-scale integration design shape according to the identified class.

The training phase is a learning process wherein training design shapes (e.g. training patterns) are assigned ground-truth class labels. Especially, the classification of the VLSI design patterns is performed based on physical events causally linked to the printability for the VLSI design patterns. By definition, the causality is a form of dependence relationship between two events, one of which, referred to as the effect, is a consequence of the other event, the cause. In the context of the present disclosure, the causal link is identified between an event of appearance of a particular design pattern in a given pattern, and physical phenomena that lead to the given pattern being printable or not printable. During the lithographic process of an integrated circuit, a series of physical phenomena (also referred to as physical events) happen and impact on the printability of design shapes on the integrated circuit. For instance, these of physical phenomena may be related to the light propagation over the mask layout for etching the integrated circuit or effects of chemical products over the mask layout. These physical phenomena are deterministic in the sense there is no randomness regarding the fact they will happen; however, their manifestation is stochastic since it is too complex a task to predict when they will occur based on first-principle analysis. The disclosure relies on modeling the manifestations of these physical phenomena for identifying classes of printability of design patterns. In particular, the printability of a design pattern is assessed by means of probabilistic model function which maximizes a probability of a class. Thus, the disclosure proposes a model-based printability predicting classifier (P2C) relying on physical events causally linked to the printability of design shapes during the training phase.

Referring to FIG. 1, an example of a VLSI design cycle as known in the art is depicted. The designer designs 100 an integrated circuit using a VLSI design process. The designer draws the physical layout of the integrated circuit so that a mask layout is provided and used to define patterns on objects. The mask is used in a lithographic system to define patterns on semiconductor wafers to manufacture the integrated circuit. In practice, the physical layout is divided into pattern tiles, each pattern tile having a fixed-size window in the layout. The pattern tile can be of arbitrary shape and size, and these may be layer-dependent. The placement of a pattern tile in the layout layer and its size determine the tiles design pattern. A design pattern is any two-dimensional arrangement of design shapes within a particular pattern tile. Preferably, the design pattern is a rectilinear polygon. Design shapes are any two-dimensional shape that is part of the layout. The term includes shapes drawn by the user, and also sub-resolution assist features (SRAF).

Once the design is achieved, a design rule check (DRC) 110 procedure is carried out. A set of design rules is applied to a design pattern and identifies features (e.g. the design shapes) of the design pattern that violate the applied rules. In practice, a rule relates to a geometric measurement in the space of drawn features. As an example, a rule may define a minimum spacing value between two features. As another example, a rule may define a minimum width value for a feature. As another example, a rule may define a minimum area of a feature.

As a result of the DRC procedure, a simulation of the printability of the design patterns is performed 120 so as to avoid production yields problems. A pattern tile, a design pattern is referred to as printable if it passes the simulation. A full chip simulation may be performed by emulating a mask and simulate a print image. The simulation may also be limited to a given pattern tile, design pattern, or design shape. The simulation is the cause of excessive computational burden.

After the simulation, an analysis of the errors 140 predicted by the simulation is carried out. As a result, new rules can be implemented 150 in order to corrected mismatches detected by the simulation. The implementation of the new rules may be manually performed by the designer, or automatically performed.

Concomitantly, a retargeting 160 is performed for converting the layout in accordance with the predicted errors. A set of candidate designs are visited and their parameters are adjusted in an attempt to satisfy the user's specifications, as known in the art. For instance, the adjustments may include resizing the circuit.

After that non-printable design patterns have been eliminated from the layout, a printable design mask is provided 160, ending the VLSI design cycle.

Figure 2:
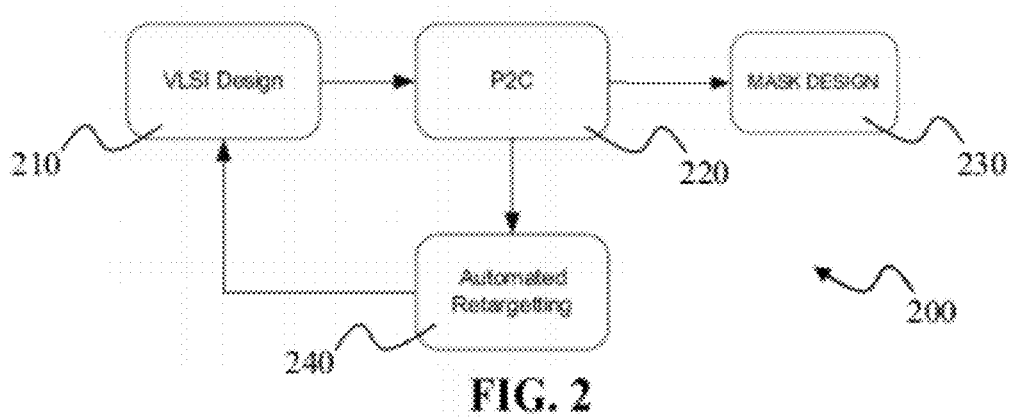
FIG. 2 is an example of a VLSI design cycle according to the disclosure.

Referring now to FIG. 2, a VLSI design process 200 according to the disclosure is depicted. The VLSI design process 200 may be implemented for instance on a computerized-system such as a workstation.

At step 210, the designer designs an integrated circuit. This step is similar to the one described at the step 100 on FIG. 1.

Then, at step 220, a printability-predicting classification is carried out, for instance by a printability-predicting classifier (P2C) running for instance on the computerized-system. The printability-predicting classification aims at replacing the steps 110, 120, 140, and 150 depicted in FIG. 1, namely the DRC verification, the full-chip simulation, the analysis of the predicted error, and the implementation of new rules.

Indeed, in the language of artificial intelligence, the DRC procedure is a form of a rule-based expert system that is deployed to aid a design decision process. In this sense, DRC is a list of "IF A THEN B" statements, where A is a particular set of measurements of the design, and B is a decision regarding the printability of a given layout fragment. Traditional sets of DRC rules are derived from human observations of learning samples of patterns that pass and that do not pass. In this sense, it is a system that can be described in terms of machine learning theory, even if learning has been traditionally delegated to the human creators of DRC despite humans are not adept at capturing dependencies in multiple dimensions.

While a particular set of measurements of the design A (also referred to as space of A) can be very diversified, B is basically an equivalent of a classifier that decides between two classes: printable, or not printable. This dichotomization can be executed by a rule based system, but such systems have limited application and success in pattern recognition.

Therefore, the traditional DRC procedure is replaced by a learned, model-based, printability-predicting classifier (P2C). In other terms, the P2C is a learning machine which substitutes the arduous simulations with a classification-based approach.

Thus, at the step 220, each design pattern (that is, a set of VLSI design shapes) forming the design layout drawn by the designer at step 210 is assigned by the P2C to a class, e.g. printable or non printable.

Optionally, at step 240, a retargeting is performed for converting the layout in accordance with the classification provided by the step 220. The retargeting is automatically performed as known in the art.

Figure 4:
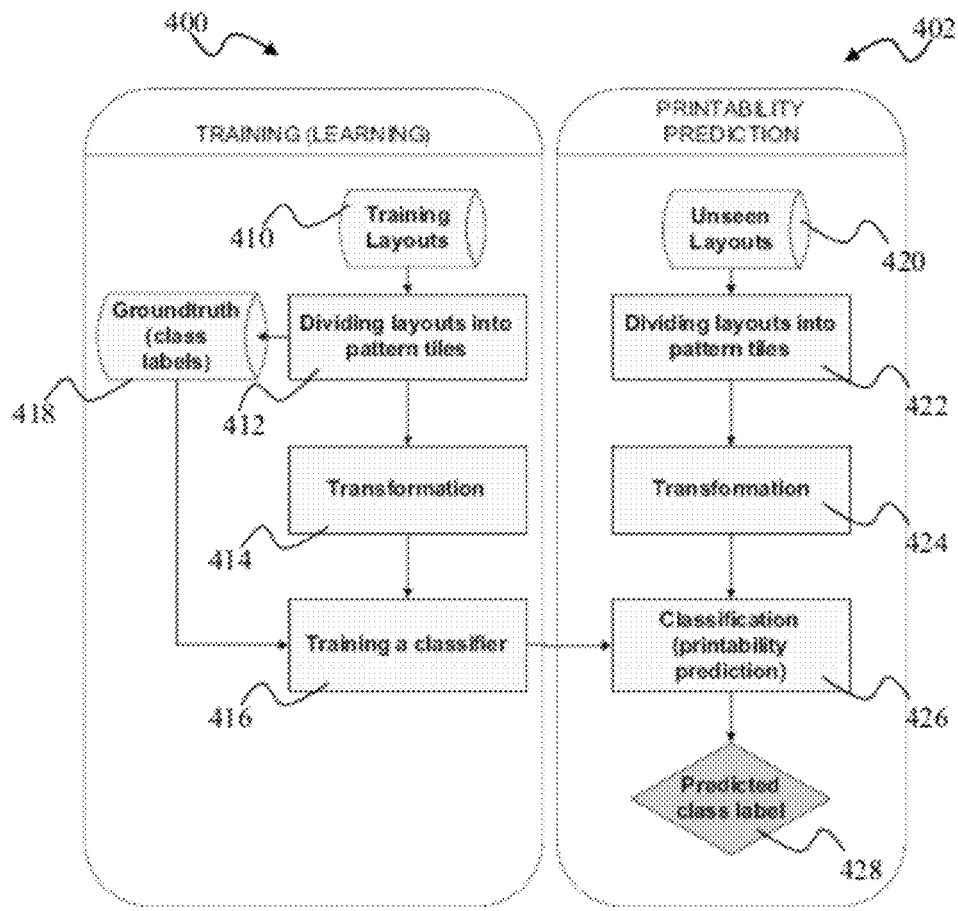
FIG. 4 is a flowchart depicting an embodiment of a method of assessing printability of a VLSI design according to the disclosure.

Referring now to FIG. 4, a flowchart depicting an embodiment of a method of assessing printability of VLSI design patterns according to the disclosure is depicted. The flowchart describes the necessary steps of the learning 400 of the P2C learning machine, and the steps of the printability prediction 402 of the P2C. In other words, the printability of VLSI designs is assessed during the testing phase 402 taking decisions based on knowledges acquired during the training phase 400.

For the sake of clarity, one reminds that the underlying assumption of P2C is that printability of a given shape can be treated as a stochastic manifestation of a series of deterministic physical phenomena that happen during the lithographic process. The disclosure thus relies on these physical phenomena for identifying classes of printability of design shapes. In particular, the printability of a design shape is assessed by means of probabilistic model function which maximizes a probability of a class. Thus, the disclosure proposes a model-based printability predicting classifier (P2C) relying on physical events causally linked to the printability of design shapes.

As such, the concept of printability may be thought of a probably approximately correct learnable, also known as PAC-learnable. In the PAC framework, the learner gets training samples classified according to a function from a certain class, and the learner is to find an approximation of the function with high probability.

Figure 3:
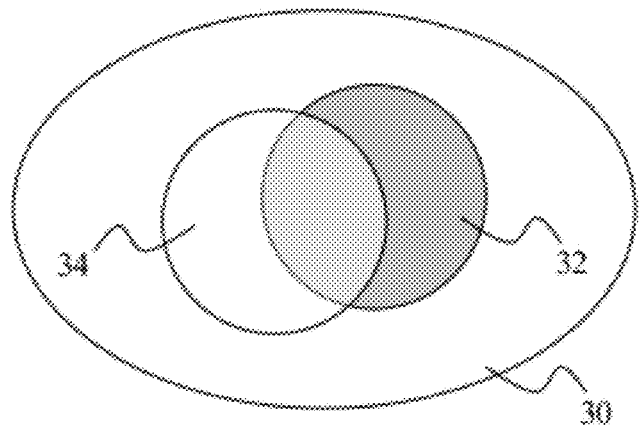
FIG. 3 depicts an example of entire design space.

Referring back to FIG. 4, the P2C can be trained using observed samples (step 410). The objective of training is to minimize the classification error of a given pattern, where the risk is a function of an error rate and an error cost. To this aim, training layouts may be generated by a dedicated tool. The generated training layouts can covers a design space, as depicted in FIG. 3. In addition, training layouts may originate from actual designs.

Referring now to FIG. 3, a Venn diagram is depicted on which an ellipse 30 represents a design space covered by the generated design shapes. The ellipse 34 represents the patterns precluded by DRC. The ellipse 32 represents the subset of actually non-printable patterns. The exclusive disjunction of the ellipses 32 and 34 is a union of subsets including patterns erroneously precluded, or erroneously missed by the DRC procedures.

Referring back to FIG. 4, the tool can generate training layout that purposefully violate current DRC rules. Advantageously, this allows identifying patterns that are erroneously identified by DRC as non-printable, and the actually non-printable patterns that erroneously pass the DRC scrutiny. Moreover, by having a possibility to exhaustively simulate and examine the entire design space and the space of errors, it is possible to be highly confident that the P2C receives sufficient data to train statistical classification models.

At step 412, the training layouts are divided into pattern tiles, that is, fixed-size part of the training layouts. Each pattern tile comprises one or more design pattern, a design pattern being an arrangement of design shapes.

FIG. 4 depicts an embodiment wherein training layouts are divided into pattern tiles are provided for training the P2C. It is to be understood that the P2C can be trained with training patterns, or more generally, with training sets of VLSI design shapes.

At step 414, a set of mathematical representations of the pattern tiles set is obtained, thus allowing further processing of the pattern. The mathematical representations may be obtained, for instance, by transforming a VLSI design shape into spatial-frequency domain. Preferably, the mathematical representation is a fixed-length vector representation.

Next, at step 418, at least two classes of physical events causally linked to the printability for the very-large-scale integration design shapes are identified. Each one of the classes is associated to a respective level of printability (in the simplest binary case, two classes represent a dichotomy between 'printable' and 'non-printable'). Indeed, as seen above, series of physical events (also referred to as physical phenomena) impact on the printability of design shapes. In practice, a first class is associated to a level of printability corresponding to a printable VLSI design shape, and a second one to a level of printability corresponding to a non-printable VLSI design shape. Then, each mathematical representation of the set is labeled according to one of the identified classes, based on a lithography model. For instance, if the first class corresponds to a level 0, and the second one to a level 1, a mathematical representation of a pattern labeled 0 is printable and a mathematical representation of a pattern labeled 1 is non printable.

As mentioned above, training layouts can be provided by a dedicated tool or can originate from actual designs. The training patterns are assigned ground-truth class labels based on the full-chip printability simulations.

Then, at step 416, a probabilistic model function maximizing a probability of a class is selected, given the set of mathematical representations. The function is selected so that the probability of misclassification of a given pattern during the test phase 402 is minimized, the risk being defined as a function of the error rate and the error cost.

The testing phase 402 starts with a step of providing a layout to be tested. This can be performed while designing the layout or once the complete layout has been designed. In practice, the layout is an unseen layout, and its printability is not known. One understands that design patterns, or more generally a set of VLSI design shapes, may be tested.

At step 422, the layout is divided into pattern tiles. This step is similar to the step 412.

Next, a mathematical representation of a layout to be tested is obtained (step 424). This is performed in the same way as for the step 414 of the training phase.

Then, at step 426, the prediction of the printability of the unseen layout is carried out. In a first sub-step, estimates of posterior probabilities are computed for each of the identified classes, given the obtained mathematical representation. In a second sub-step, according to the results of the computation sub-step, the class with the highest estimate of posterior probabilities obtained is identified.

Then, at step 428, the provided layout to be tested is labeled, printable or non printable, according to the class identified at the previous step 426.

As mentioned earlier, the P2C allows substituting the arduous simulations with a classification-based approach. Indeed, the P2C returns equivalent predictions of printability of a given shape as a physical full chip simulation.

Advantageously, the P2C approach is faster than the physical full chip simulation. First, the speedup results from that a full-chip simulation explicitly generates a simulated mask and a simulated image of the printed layout. The printability prediction in a full-chip simulation is a result of a necessary post-processing and analysis of predicted image contours (inner-nominal-outer). The P2C directly produces a printability classification decision, without the expensive mask and image simulation steps. Secondly, the P2C is parametrically simpler than a full-chip simulation because, in order to produce an accurate classification decision, it may not be necessary to build an accurate model of the underlying stochastic process. Indeed, it suffices to correctly recognize the decision hypersurface that separates the class-conditional distributions in a chosen feature space. This difference has been frequently observed in comparisons between the generative and the discriminative classifiers. Thus, the P2C training is facilitated.

In practice, two possible use models for the VLSI design process exist. The first use model is an offline printability assessing wherein a readily available, pre-existing layout, which must be checked for printability within a given technology node. This can be the case with re-scaled printable designs from previous technology nodes (for instance a 45 nm layout scaled down to 22 nm), which already respect some of the basic design rules. In this use model, the P2C module is used to scan the entire layout for printability defects, and send them for manual or automatic retargeting.

The second use model is an online design support. In this use model, the P2C is used as a fast tool for fast printability checking while design is underway. If the design is done by a human designer, the tool can be implemented as an interactive tool that visually marks probable printability problems on the designer's desktop. If the layout is designed using an automatic design tool, the P2C module can provide a fast and accurate input for global layout design optimization. In this latter case, the design process can take into account also such factors as compactness, power etc.

In both use models, the expected benefits of using P2C over traditional DRC include greater accuracy and speed in printability prediction. Especially, the actual online classification of unseen patterns requires only a computation of the sign of the distance from the decision hypersurface to the point that represents the classified pattern in the feature space.

As will be appreciated by one skilled in the art, aspects of the present disclosure may be embodied as a system, method or computer program product. Accordingly, aspects of the present disclosure may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present disclosure may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fibre, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present disclosure may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present disclosure are described above with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present disclosure. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

Figure 5:
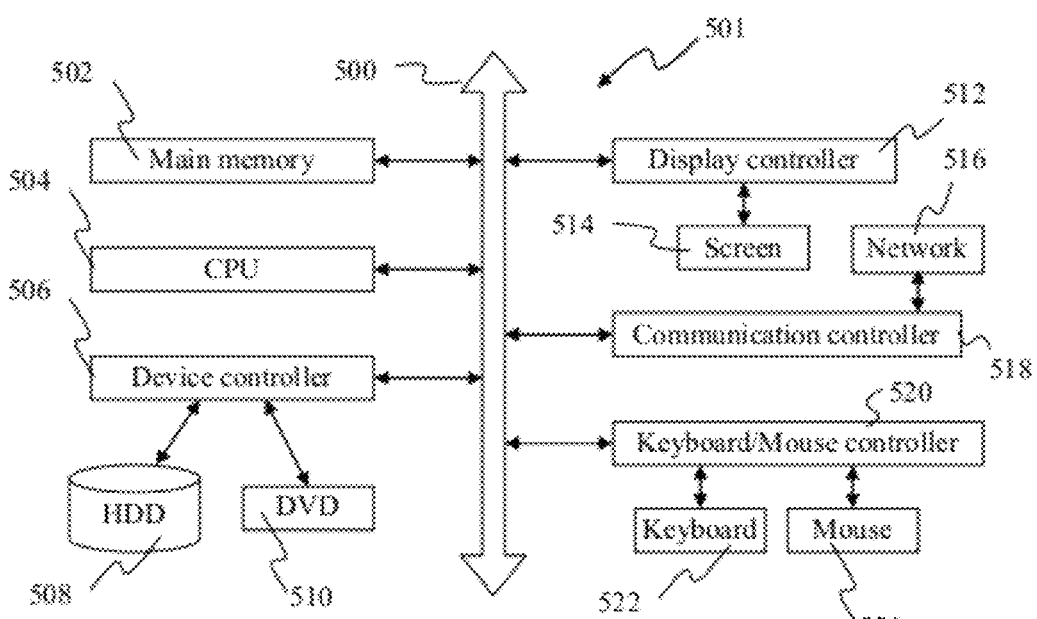
FIG. 5 is a block diagram of computer hardware according to an embodiment of the present disclosure.

FIG. 5 is a block diagram of computer hardware according to an embodiment of the disclosure. A computer system (501) according to an embodiment of the disclosure included a CPU (504) and a main memory (502) which are connected to a bus (500). The bus (500) is connected to a display controller (512) which is connected to a display (514) such as an LCD monitor. The display (514) is used to display information about a computer system. The bus (500) is also connected to a storage device such hard disk (508) or DVD (510) through a device controller (506) such as an IDE or SATA controller. The bus (504) is further connected to a keyboard (522) and a mouse (524) through a keyboard/mouse controller (510) or a USB controller (not shown). The bus is also connected to a communication controller (518) conforms to, for example, an Ethernet (registered trademark) protocol. The communication controller (518) is used to physically connect the computer system (501) with a network (516).

While the disclosure has been described in terms of specific embodiments, it is evident in view of the foregoing description that numerous alternatives, modifications and variations will be apparent to those skilled in the art. Accordingly, the disclosure is intended to encompass all such alternatives, modifications and variations which fall within the scope and spirit of the disclosure and the following claims.

What is claimed is:

1. A method of assessing printability of a very-large-scale integration design for creating an integrated circuit, the method comprising:
    performing a first set of steps during a training phase, said first set of steps comprising:
        generating a training set of very-large-scale integration design shapes representative of a population of very-large-scale integration design shapes;
        obtaining a set of mathematical representations of respective shapes in the training set;
        identifying at least two classes of physical events causally linked to the printability for the very-large-scale integration design shapes, each of the classes being associated to a respective level of printability;
        labeling each mathematical representation of the set according to one of the identified classes, based on a lithography model; and
        selecting a probabilistic model function maximizing a probability of a class, given the set of mathematical representations;
    and performing a second set of steps during a testing phase, said second set of steps comprising:
        providing a very-large-scale integration design shape to be tested;
        testing the provided very-large-scale integration design shape,
            by obtaining a mathematical representation of the provided very-large-scale integration design shape;
            by computing estimates of posterior probabilities for each of the identified classes, given the obtained mathematical representation; and by identifying the class with the highest estimate of posterior probabilities obtained; and labeling the provided very-large-scale including at least one memory drive and a processor drive integration design shape according to the identified class, wherein a computer system including at least one memory device and a processor device is configured to perform one or more said first set and second set of steps.

2. The method of claim 1, wherein, at both the training and testing phases, a step of obtaining a mathematical representation comprises transforming a very-large-scale integration design shape into spatial-frequency domain.

3. The method of claim 2, wherein said mathematical representation is a fixed-length vector representation.

4. The method of claim 1, wherein the probabilistic model function is selected according to a probably approximately correct learning algorithm.

5. The method of claim 4, wherein a first class is associated to a level of printability corresponding to a printable very-large-scale integration design shape, and a second class is associated to a to level of printability corresponding to a non-printable very-large-scale integration design shape.

6. The method of claim 1, wherein the training set of very-large-scale integration design shapes comprises at least one very-large-scale integration design shape violating a predetermined design rule.

7. The method of claim 6, wherein the predetermined design rule is selected so that said at least one very-large-scale integration design shape is erroneously identified as violating the predetermined design rule.

8. The method of claim 1, wherein the testing phase is carried out while creating the integrated circuit.

9. The method of claim 1, wherein the testing phase is carried out once the integrated circuit is created.

10. A system for creating an integrated circuit using very-large-scale integration design, the system comprising:
a memory storage device;
a processor device connected to the memory device, wherein the processor device is configured to:
perform a first set of steps during a training phase, said first set of steps comprising:
generating a training set of very-large-scale integration design shapes representative of a population of very-large-scale integration design shapes;
obtaining a set of mathematical representations of respective shapes in the training set;
identifying at least two classes of physical events causally linked to the printability for the very-large-scale integration design shapes, each of the classes being associated to a respective level of printability;
labeling each mathematical representation of the set according to one of the identified classes, based on a lithography model; and
selecting a probabilistic model function maximizing a probability of a class, given the set of mathematical representations;
and perform a second set of steps during a testing phase, said second set of steps comprising:
providing a very-large-scale integration design shape to be tested;
testing the provided very-large-scale integration design shape,
by obtaining a mathematical representation of the provided very-large-scale integration design shape;
by computing estimates of posterior probabilities for each of the identified classes, given the obtained mathematical representation; and
by identifying the class with the highest estimate of posterior probabilities obtained; and
labeling the provided very-large-scale integration design shape according to the identified class.

11. The system of claim 10, wherein, at both the training and testing phases, a step of obtaining a mathematical representation comprises transforming a very-large-scale integration design shape into spatial-frequency domain.

12. The system of claim 11, wherein said mathematical representation is a fixed-length vector representation.

13. The system of claim 10, wherein the probabilistic model function is selected according to a probably approximately correct learning algorithm.

14. The system of claim 13, wherein a first class is associated to a level of printability corresponding to a printable very-large-scale integration design shape, and a second class is associated to a to level of printability corresponding to a non-printable very-large-scale integration design shape.

15. The system of claim 10, wherein the training set of very-large-scale integration design shapes comprises at least one very-large-scale integration design shape violating a predetermined design rule.

16. The system of claim 15, wherein the predetermined design rule is selected so that said at least one very-large-scale integration design shape is erroneously identified as violating the predetermined design rule.

17. The system of claim 10, wherein the system is configured to carry out the testing phase while creating the integrated circuit.

18. The system of claim 10, wherein the system is configured to carry out the testing phase once the integrated circuit is created.

19. A non-transitory computer readable medium embodying a computer program for assessing printability of a very-large-scale integration design for creating an integrated circuit, said computer program comprising code means for causing a computer to perform a first set of steps during a training phase, said first set of steps comprising:
generating a training set of very-large-scale integration design shapes representative of a population of very-large-scale integration design shapes;
obtaining a set of mathematical representations of respective shapes in the training set;
identifying at least two classes of physical events causally linked to the printability for the very-large-scale integration design shapes, each of the classes being associated to a respective level of printability;
labeling each mathematical representation of the set according to one of the identified classes, based on a lithography model; and
selecting a probabilistic model function maximizing a probability of a class, given the set of mathematical representations;
and to perform a second set of steps during a testing phase, said second set of steps comprising:
providing a very-large-scale integration design shape to be tested;
testing the provided very-large-scale integration design shape,
by obtaining a mathematical representation of the provided very-large-scale integration design shape;
by computing estimates of posterior probabilities for each of the identified classes, given the obtained mathematical representation; and by identifying the class with the highest estimate of posterior probabilities obtained; and labeling the provided very-large-scale integration design shape according to the identified class.

20. The non-transitory computer readable medium of claim 19, wherein, at both the training and testing phases, a step of obtaining a mathematical representation comprises transforming a very-large-scale integration design shape into spatial-frequency domain.

21. The non-transitory computer readable medium of claim 20, wherein said mathematical representation is a fixed-length vector representation.

22. The non-transitory computer readable medium of claim 19, wherein the probabilistic model function is selected according to a probably approximately correct learning algorithm.

23. The non-transitory computer readable medium of claim 22, wherein a first class is associated to a level of printability corresponding to a printable very-large-scale integration design shape, and a second class is associated to a to level of printability corresponding to a non-printable very-large-scale integration design shape.

24. The non-transitory computer readable medium of claim 19, wherein the training set of very-large-scale integration design shapes comprises at least one very-large-scale integration design shape violating a predetermined design rule.

25. The non-transitory computer readable medium of claim 24, wherein the predetermined design rule is selected so that said at least one very-large-scale integration design shape is erroneously identified as violating the predetermined design rule.

* * * * *